(12) United States Patent
Nagai et al.

(10) Patent No.: US 7,037,448 B2
(45) Date of Patent: May 2, 2006

(54) METHOD OF PRODUCING A CONDUCTOR PASTE

(75) Inventors: Atsushi Nagai, Aichi (JP); Hideyuki Tomita, Aichi (JP); Noriyuki Abe, Aichi (JP)

(73) Assignee: Noritake Co., Limited, Nagoya (JP)

( * ) Notice: Subject to any disclaimer, the term of this patent is extended or adjusted under 35 U.S.C. 154(b) by 265 days.

(21) Appl. No.: 10/683,701

(22) Filed: Oct. 14, 2003

(65) Prior Publication Data
US 2004/0124400 A1    Jul. 1, 2004

(30) Foreign Application Priority Data
Oct. 17, 2002    (JP) .............................. 2002-303301

(51) Int. Cl.
 B05D 5/12    (2006.01)
 H01B 1/22    (2006.01)
(52) U.S. Cl. ...................... 252/514; 427/96.1; 427/125
(58) Field of Classification Search ................ 252/514; 427/96.1, 125; 209/659, 689
See application file for complete search history.

(56) References Cited

U.S. PATENT DOCUMENTS

| | | | |
|---|---|---|---|
| 5,687,055 A | 11/1997 | Miki | |
| 6,141,846 A | 11/2000 | Miki | |
| 6,277,169 B1 * | 8/2001 | Hampden-Smith et al. | ... 75/336 |
| 6,366,444 B1 | 4/2002 | Yagi | |
| 6,406,646 B1 * | 6/2002 | Lee et al. | ..... 252/514 |
| 6,733,695 B1 * | 5/2004 | Onami et al. | ........ 252/514 |
| 6,733,696 B1 * | 5/2004 | Anao | .............. 252/514 |
| 2004/0245507 A1 | 12/2004 | Nagai et al. | |

FOREIGN PATENT DOCUMENTS

| | | |
|---|---|---|
| JP | A 6-139813 | 5/1994 |
| JP | A 6-295614 | 10/1994 |
| JP | A-7-211132 | 8/1995 |
| JP | A 9-231834 | 9/1997 |
| JP | A 9-310006 | 12/1997 |
| JP | A-10-134637 | 5/1998 |
| JP | A 10-154629 | 6/1998 |
| JP | A 2001-250422 | 9/2001 |
| JP | A-2002-298651 | 10/2002 |

* cited by examiner

Primary Examiner—Mark Kopec
(74) Attorney, Agent, or Firm—Oliff & Berridge PLC

(57) ABSTRACT

The present invention provides a conductor composition that can form a conductor pattern having a good shape precision and a method for producing an electronic component using the composition. This conductor composition contains an organic vehicle, and a conductive powder (typically Ag powder) made of a noble metal or an alloy based on a noble metal, contained in a mass ratio of 80 mass % or more in the conductor composition, and having an average particle size of 0.8 μm or less, and a ratio ($D_{50}/D_{min}$) of the medium value $D_{50}$ of the particle sizes to the minimum value $D_{min}$ of the detectable particle sizes of 5 or less. This conductor composition has preferably a ratio ($V_{1rpm}/V_{10rpm}$) of the vicosity $V_{1rpm}$ 1 rpm and the viscosity $V_{10rpm}$ 10 rpm is in the range from 2 to 5.

16 Claims, 3 Drawing Sheets

METHOD OF PRODUCING A CONDUCTOR PASTE

This application claims priority to Japanese Patent Application No. 2002-303301, filed Oct. 17, 2002, the contents of which are incorporated herein by reference.

BACKGROUND OF THE INVENTION

1. Field of the Invention

The present invention relates to conductor compositions prepared in the form of a paste or ink and used to form film conductors on a base material such as a ceramic base maternal or the like. More specifically, the present invention relates to conductor compositions suitable for forming film conductors having a comparatively fine pattern. Furthermore, the present invention relates to a method for, producing an electronic component having film conductors by using such a conductor composition.

2. Description of the Related Art

Conductor compositions in the form of a paste or ink (hereinafter, a composition in this form is referred to as "conductor paste") are used as a material for forming film conductors (wiring, electrodes, etc.) having a predetermined pattern in a wiring board used to construct a hybrid IC, a multichip module or the like or other electronic components. This conductor paste is a conductor forming material prepared by dispersing a metal powder, which is the main component for forming a conductor, and various additives (inorganic binder, glass frit, filler, etc.), which are added, if necessary, in a predetermined organic medium (vehicle). Such a conductor paste is printed or applied to a ceramic base material by a general method such as screen printing. Then, this applied substance (coating film) is fired (baked) at an appropriate temperature, so that a film conductor (conductor pattern) having a predetermined pattern is formed on the ceramic electronic component such as the ceramic base material.

Examples of references of the related art regarding the conductor paste include Japanese Laid-Open Patent Publication Nos. 2001-250422, 10-154629, 9-310006, 6-139813, 9-231834 and 6-295614.

SUMMARY OF THE INVENTION

It is useful to improve the shape precision of the conductor pattern formed with such a conductor paste. For example, finer conductor patterns (fine patterns) can be formed efficiently. This makes it possible to achieve high density of electronic components.

Therefore, it is an objective of the present invention to provide a conductor paste that can form a conductor pattern having a good shape precision. It is another objective of the present invention to provide a method for producing an electronic component by using such a conductor paste.

The inventors of the present invention found that the above-described problems can be solved by considering the characteristics of a conductive powder contained in the conductor paste and the composition of the conductor paste.

The present invention is directed to a conductor paste comprising a conductive powder made of a noble metal or an alloy based on a noble metal and an organic vehicle. The ratio (metal content) of the conductive powder in the conductor paste is 80 mass % or more. The average particle size of the particles (conductor particles) constituting the conductive powder is 0.8 μm or less (typically 0.1 to 0.8 μm). The ratio ($D_{50}/D_{min}$) of the medium value $D_{50}$ of the particle size to the minimum value $D_{min}$ of the detectable particle sizes of the conductor particles constituting the conductive powder is in the range of 1 to 5.

With the conductor paste having such a constitution, a conductor pattern having an excellent shape accuracy can be formed. For example, at least one of the following can be realized: reduction of the roughness (swell or the like) on the surface of the conductor pattern; reduction of the roughness (swell or the like) that is not intended on the edge of the conductor pattern; suppression of the short-circuit (aberration of a pattern or the like) that is not intended between conductor patterns that should be formed apart; and suppression of discontinuation of a conductor pattern that should be continuous. Thus, the performance to form a conductor pattern that is close to a desired shape (has a good shape accuracy) is improved In a preferable embodiment of the conductor paste of the present invention, the ratio ($V_{1rpm}/V_{10rpm}$) of a viscosity $V_{1rpm}$ measured under conditions at 1 rpm with a spindle No. 4 with a Brookfield rotational viscometer (Brookfield type viscometer) and a viscosity $V_{10rpm}$ measured under conditions at 10 rpm with a spindle No. 4 is in the range from 2 to 5.

The conductor paste having such viscosity characteristics has good shape retention properties of the applied conductive paste (applied substance). For example, the conductor paste applied in a predetermined pattern hardly changes in shape. Therefore, the shape of the applied pattern is hardly blurred during a time before the applied substance is fired. For this reason, a conductor pattern having an even butter shape accuracy can be formed. This conductor paste has a good suitability for screen printing. For example, the paste satisfactorily passes through a screen. Therefore, this conductor paste is particularly suitable to be used to form a conductor pattern when screen printing is applied.

In another preferable embodiment of such a conductor paste, a solvent constituting the organic vehicle has a boiling point of 200° C. or more. The conductor paste having such a composition contains a solvent having a high boiling point, and therefore, for example, when the conductor paste is attached onto a base material by screen printing, clogging of the screen hardly occurs. Thus, a conductor pattern having a good shape accuracy can be produced, even if screen printing is performed repeatedly.

The present invention provides a method for producing an electronic component comprising a base material on which a film conductor (conductor pattern) is formed. The production method includes preparing any one of the above-described conductor compositions of the present invention. Furthermore, the method includes attaching the conductor paste onto the base material, and also includes firing the attached conductor paste. This method makes it possible to produce efficiently an electronic component provided with a conductor pattern having an excellent shape accuracy.

This method is preferably adopted when an electronic component provided with a film conductor (conductor pattern) having a linear portion of a width of 50 μm or less. This is because the advantage (typically, the advantage of good performance for forming a conductor pattern having an excellent shape accuracy) of the conductor paste of the present invention can be exhibited well in formation of a conductor pattern including such a fine line portion (fine line).

DESCRIPTION OF THE PREFERRED EMBODIMENTS

Figure 1:
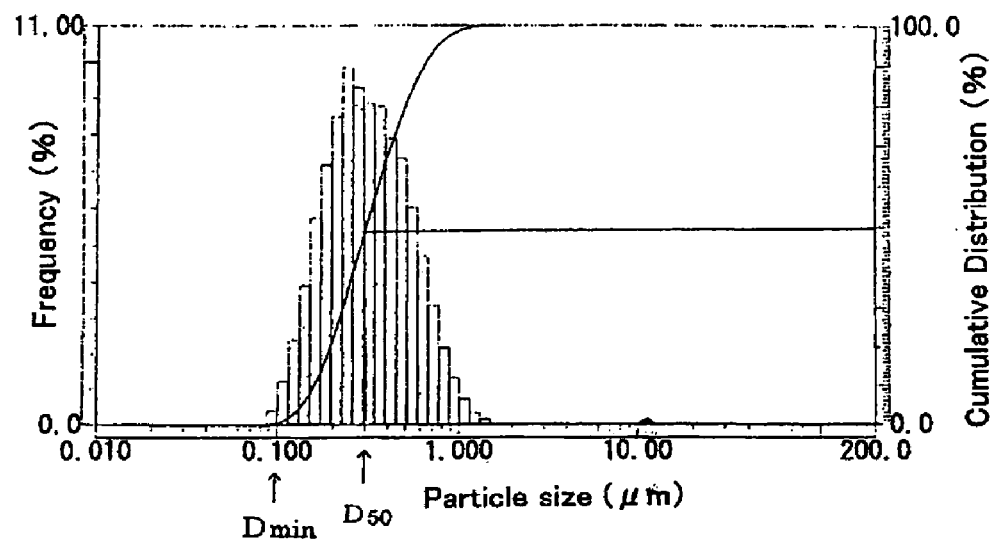
FIG. 1 is a graph showing the results of particle size distribution measurement of an Ag powder 1 used for conductor pastes of experiment examples.

Hereinafter, preferred embodiments of the present invention will be described in detail. The matters that are other than the matters mentioned in the specification and are necessary to carry out the present invention can be construed as matters of design of those skilled in the art based on the conventional technique in the art. The present invention can be carried out based on the content disclosed in the specification and the technical common knowledge in the art.

Examples of "conductive powder" constituting the conductor paste of the present invention include a single substance of noble metals such as silver (Ag), platinum (Pt), palladium (Pd), gold (Au) and alloys of these metals (Ag—Pd alloy, Pt—Pd alloy or the like), and alloys of the aforementioned noble metals and other metals. Among these, one or at least two can be used. Preferable conductive powders of the present invention are silver, alloys based on silver, platinum or alloys based on platinum, for example. Conductive powders made of silver or alloys based on silver (Ag—Pd alloys or the like) are most preferably used because of their low cost and low electrical resistance.

The average particle size of this conductive powder is suitably 0.8 µm or less (typically 0.1 to 0.8 µm), and preferably 0.5 µm or less (typically 0.2 to 0.5 µm). A conductive powder that does not substantially contain particles of having a particle size of 5 µm or more (more preferably 2 µm or more) is preferably used. There is no limitation regarding the shape of the particles constituting this conductive powder, and spherical, flake-like, conical, rod-like particles can be used. It is preferable to use spherical particles because they can be formed into an excellently filled and dense conductor film.

It is preferable that the particle size distribution of the conductive powder is sharp. The degree of the sharpness (narrowness) of the particle size distribution can be represented by the ratio ($D_{50}/D_{min}$) of the medium value $D_{50}$ of the particle sizes to the minimum value $D_{min}$ of the detectable particle sizes. Herein, as the minimum value $D_{min}$ of the detectable particle sizes, the value representing the minimum particle size of the particle sizes (whose frequency exceeds 0) of the detected particles in the particle size distribution graph obtained by measurement with a particle size distribution measuring device utilizing the laser diffraction (laser diffraction/scattering particle size distribution measuring device, model LA-920, etc. manufactured by Horiba Seisakusho Co. Ltd) can be used (see FIG. 1). As the medium value $D_{50}$ of the particle sizes, the value of the median size (value of the average particle size) measured by the above-described particle size distribution measuring device can be used. In general, the powder that has a sharper particle size distribution has a smaller particle size ratio ($D_{50}/D_{min}$).

Preferably, the conductive powder of the present invention has a particle size distribution in which the particle size ratio ($D_{50}/D_{min}$) is 1 to 5 (typically $1.2 \leq (D_{50}/D_{min}) \leq 5$). More preferably, the conductive powder has a particle size distribution in which the particle size ratio ($D_{50}/D_{min}$) is 1 to 4 (typically $1.2 \leq (D_{50}/D_{min}) \leq 4$). Even more preferably, the conductive powder has a particle size distribution in which the particle size ratio ($D_{50}/D_{min}$) is 1 to 3 (typically $1.5 \leq (D_{50}/D_{min}) \leq 3$). The conductor paste obtained with a conductive powder having such an average particle size and particle size distribution can be formed into a dense conductor film that is filled excellently with the conductive powder. This is advantageous in order to form a fine conductor pattern with a good shape precision.

Typical examples of conductive powders that are preferable for the conductor paste of the present invention are shown below:

(1) conductive powder having $D_{50}$ of about 0.2 µm and $D_{min}$ of about 0.04 to 0.16 µm (preferably about 0.06 to 0.13 µm);

(2) conductive powder having $D_{50}$ of about 0.3 µm and $D_{min}$ of about 0.06 to 0.25 µm (preferably about 0.1 to 0.2 µm)

(3) conductive powder having $D_{50}$ of about 0.4 µm and $D_{min}$ of about 0.08 to 0.33 µm (preferably about 0.13 to 0.27 µm);

(4) conductive powder having $D_{50}$ of about 0.5 µm and $D_{min}$ of about 0.1 to 0.4 µm (preferably about 0.16 to 0.33 µm);

(5) conductive powder having $D_{50}$ of about 0.6 µm and $D_{min}$ of about 0.12 to 0.5 µm (preferably about 0.2 to 0.4 µm);

(6) conductive powder having $D_{50}$ of about 0.7 µm and $D_{min}$ of about 0.14 to 0.6 µm (preferably about 0.23 to 0.47 µm).

There is no limitation regarding a method for producing the conductive powder having such an average particle size and particle size distribution A conductive powder (typically Ag powder) produced by, for example, well-known wet reduction methods, gas phase reaction methods, gas reduction methods or the like and, if necessary, classified, can be used. Classification can be performed with a classifier utilizing centrifugation or the like.

There is no particular limitation regarding the organic vehicle in which the conductive power is dispersed, and a conventional organic vehicles used for a conductor paste can be used. For example, organic binders based on cellulose material such as ethyl cellulose and hydroxyethyl cellulose, acrylic resins such as polybutylmethacrylate, polymethylmethacrylate, and polyethylmethacrylate, epoxy resin, phenol resin, alkyd resin, polyvinyl alcohol, polyvinyl butyral or the like; and organic solvents, for example, ester solvents such as butyl cellosolve acetate, butyl carbitol acetate, ether solvents such as butyl carbitol, ethyleneglycol and diethyleneglycol derivatives, toluene, xylene, mineral spirit, terpineol, and menthanol can be used.

Preferably, a solvent constituting an organic vehicle is an organic solvent having a boiling point of about 200° C. or more (typically about 200 to 260° C.). An organic solvent having a boiling point of about 230° C. or more (typically about 230 to 260° C.) can be used more preferably. Most preferable examples of such an organic solvent include butyl carbitol, butyl carbitol acetate and 2,2,4-trimethyl-1,3-pentanediol monoisobutyrate or the like.

The content ratio of the conductive powder with respect to the entire conductor paste is suitably about 80 mass % or less (typically about 80 to 98 mass %), preferably in the range from about 80 to 95 mass %, and more preferably 85 to 95 mass %. It is preferable that the content ratio of the conductive powder is high in order to form a dense conductor pattern with a good shape precision. On the other hand, when this content ratio is too high, the handling properties or the printing suitability of the conductor paste may be reduced.

The content ratio of the organic vehicle is suitably about 1 to 20 mass %, preferably about 5 to 20 mass %, and more preferably 5 to 15 mass % with respect to the entire paste.

The organic binder constituting the organic vehicle is preferably contained in a ratio of about 10 parts by mass or less (typically about 0.1 to 10 parts by mass), more preferably about 5 parts by mass or less (typically about 0.2 to 5 parts by mass), and even more preferably about 3 parts by mass or less (typically about 0.5 to 3 parts by mass), with respect to 100 parts by mass of the conductive powder.

The ranges of the value regarding the content ratio of each component should not be construed strictly, and slight deviation from the ranges can be allowable as long as the objects of the present invention can be achieved.

It is preferable that this conductor paste has the viscosity characteristics that the viscosity ratio ($V_{1rpm}/V_{10rpm}$) of the viscosity $V_{1rpm}$ measured at a rotational speed of 1 rpm with a spindle No. 4 with a Brookfield rotational viscometer with respect to the viscosity $V_{10rpm}$ measured at a rotational speed of 10 rpm is in the range from about 2 to 5. A conductor paste having a viscosity ratio of about 3 to 4 is more preferable.

The lower the viscosity $V_{10rpm}$ at 10 rpm is, the larger the viscosity ratio ($V_{1rpm}/V_{10rpm}$) is, provided that the viscosity $V_{1rpm}$ at 1 rpm is unchanged. It is preferable that the viscosity $V_{10rpm}$ at 10 rpm (the case where the shear rate is hither than that at 1 rpm) is reduced because the conductor paste can pass through a screen (mesh) smoothly at the time of screen printing of the conductor paste. This can increase the shape precision (printing precision) when a conductor pattern is printed on a base material.

The higher the viscosity $V_{1rpm}$ at 1 rpm is, the larger the viscosity ratio ($V_{1rpm}/V_{10rpm}$) is, provided that the viscosity $V_{10rpm}$ at 10 rpm is unchanged. It is preferable that the viscosity $V_{1rpm}$ at 1 rpm (the case where the shear rate is low) is increased because the conductor paste printed on a base material is hardly spread (deformation of the paste hardly occurs). Thus, a conductor pattern having a high shape precision can be formed because the blur in the shape of the printed conductor paste is suppressed.

When the viscosity ratio ($V_{1rpm}/V_{10rpm}$) is too large, the leveling properties of the conductor paste tend to be reduced.

The viscosity of the conductor paste is preferably in the range of about 200 Pa.s or more (typically about 200 to 700 Pa.s) in the measurement at a rotational speed of 1 rpm with a spindle No. 4 with a Brookfield rotational viscometer. The viscosity at a rotational speed of 10 rpm is preferably in the range of about 100 to 300 Pa.s (more preferably about 150 to 250 Pa.s). If the viscosity of the conductor paste is too high, the handling properties or the printing suitability tends to be reduced. On the other hand, if the viscosity of the conductor paste is too low, the applied paste tends to be change in shape, so that the shape precision of the obtained conductor pattern tends to be reduced.

The viscosity of the conductor paste referred to in this specification refers to a value of the viscosity measured at room temperature. Herein, "room temperature" refers to a temperature range of 15 to 35° C., typically in a temperature range of 20 to 30° C. (e.g., 25° C.).

Such a viscosity and/or viscosity ratio can be adjusted by, for example, the ratio of the conductive powder contained in the conductor paste (metal content), the average particle size of the conductive powder, the particle size distribution of the conductive powder or the like. The viscosity and/or the viscosity ratio also can be adjusted by the type of the solvent constituting the organic vehicle, the type of the organic binder and the ratios thereof The viscosity and/or the viscosity ratio of the conductor paste can be adjusted with a viscosity modifier (plasticizer, thickener, etc.). As such a viscosity modifier, for example, plasticizers that are well-known in the field of the conductor paste such as dioctylphthalate (DOP), dioctyladipate (DOA), and dibutylphthalate (DBP) can be used. Such a viscosity modifier is contained in the conductor paste preferably in a ratio of about 5 parts by mass or less (typically about 0.01 to 5 parts by mass) with respect to 100 parts by mass of the conductive powder, more preferably about 3 parts by mass or less (typically about 0.05 to 3 parts by mass), even more preferably about 2 parts by mass or less (typically about 0.1 to 2 parts by mass).

In addition, the conductor paste of the present invention can contain various inorganic additives and/or organic additives, as long as they can achieve any one of the objects of the present invention. Examples of inorganic additives include vitreous or other ceramic powders and other various fillers. Examples of organic additives include silicon-based, titanate-based and aluminum-based coupling agents for the purpose of improving the adhesion with the ceramic base material. If it is desired to provide photocurability (photosensitivity) to the conductor paste of the present invention, various photopolymerizable compounds and photoinitiators can be added as appropriate.

Other than above, if necessary, a surfactant, an antifoamer, an antioxidant, a dispersing agent, a polymerization inhibitor or other additives can be contained as appropriate in the conductor paste of the present invention. Any additive can be used, as long as it can be used to prepare a conventional conductor paste, and will not be described in detail.

The conductor paste of the present invention can be prepared easily by, typically, mixing the conductive powder and an organic vehicle as in the case of the conventional conductor paste. In this case, if necessary, additives as described above (viscosity modifiers, etc.) can be added and mixed. For example, the conductor paste can be prepared by directly mixing the conductive powder and various additives in a predetermined mixing ratio together with an organic vehicle and kneading each other, using a three-roll mill or other kneading machines.

Next, preferable examples of formation of a film conductor (film pattern) with the conductor paste of the present invention will be described. The conductor paste of the present invention can be handled in the same manner as the conductor paste conventionally used to form a film conductor such as wiring, electrodes or the like on a ceramic base material (glass substrate, fired aluminum substrate, fired zirconia substrate, etc.) or other base materials, and a conventional known method can be used without any limitation. Typically, the conductor paste is applied (attached) onto a base material (typically glass substrate) by screen printing or coating with a dispenser or the like (most preferably screen printing) such that desired shape and thickness are achieved. Then, the applied paste component is fired (baked) and cured by heating for a predetermined time under a suitable heating condition (the maximum firing temperature is about 500 to 1000° C., preferably 600 to 900° C. in the case where a glass substrate or a fired ceramic substrate is used) in a heater, preferably after drying. With this series of operations, a ceramic electronic component (e.g., a ceramic wiring board for constructing a hybrid IC or a multichip module) on which a desired film conductor (wiring, electrodes, etc.) is formed can be obtained. Furthermore, using the ceramic electronic component as an assembly material, even more advanced ceramic electronic components (e.g., hybrid ICs or multichip modules) can be obtained by applying a conventionally known construction method. Such a construction method does not characterize the present invention and will not be described in detail.

The conductor paste of the present invention has excellent performance for forming a conductor pattern having an excellent shape precision. For this reason, the conductor paste of the present invention is suitable, for example, for forming a conductor pattern having a portion in which a plurality of linear conductor films are formed substantially in parallel, the width of these linear conductor films (line width) is about 70 μm or less (typically about 10 to 70 μm), and the gap between these linear conductor films (line gap) is about 70 μm or less (typically about 10 to 70 μm). The conductor paste of the present invention is also preferable to form a conductor pattern in which the line width is about 20 to 50 μm (more preferably about 30 to 50 μm), and the line gap is about 20 to 50 μm or less (more preferably about 30 to 50 μm).

The conductive paste of the present invention is preferable to produce an electric component provided with such a conductor pattern.

EXAMPLES

Experiment Example 1

In this experiment example, the effect of the characteristics of an Ag powder constituting the conductor paste on the performance of the conductor paste (performance for forming a conductor pattern having a good shape precision; for example, fine line formation suitability as described later) was examined.

First, four types of Ag powders as described below were prepared as the conductive powder. All of these Ag powders can be obtained by classifying with a centrifugal separator the powders produced by a general wet reduction method. The shape of these Ag powders was approximately spherical. The average particle size and the particle size ratio ($D_{50}/D_{min}$) of each Ag powder was measured with a laser diffraction/scattering particle size distribution measuring device, model LA-920 manufactured by Horiba Seisakusho Co. Ltd. FIG. 1 shows the results of the particle size distribution measurement of the Ag powder 1. The $D_{50}$ of this Ag powder was about 0.3 μm, and the $D_{min}$ was about 0.1 μm.

Conductive powders used:

Ag powder 1 having an average particle size of about 0.3 μm and a $D_{50}/D_{min}$ of about 3;

Ag powder 2 having an average particle size of about 0.7 μm and a $D_{50}/D_{min}$ of about 3.5;

Ag powder 3 having an average particle size of about 1.0 μm and a $D_{50}/D_{min}$ of about 4.5;

Ag powder 4 having an average particle size of about 1.2 μm and a $D_{50}/D_{min}$ of about 5.5.

Each Ag powder and an organic vehicle were kneaded with a three-roll mill so that the content ratio (metal content) of the Ag powder was about 90 mass %, so that samples 1 to 4 of conductive pastes were prepared. As the organic vehicle, a vehicle obtained by dissolving ethyl cellulose in butyl carbitol was used. These conductive pastes contained ethyl cellulose in a ratio of about 2 parts by mass with respect to 100 parts by mass of the Ag powder.

The viscosity of the thus obtained conductor paste was in the range from 150 to 250 Pa.s under the measurement conditions at 10 rpm. The viscosity ratio ($V_{1rpm}/V_{10rpm}$) of these conductive pastes of the sample 1 was about 4, and that of the sample 2 was about 3. The viscosity ratio ($V_{1rpm}/V_{10rpm}$) of these conductive pastes of the sample 3 was about 2.5, and that of the sample 4 was about 2.2. These viscosities and viscosity ratios were measured at 25° C. with a spindle No. 4 (spindle 4-14) with a rotational viscometer (model HBT type DV III+) manufactured by Brookfield Co.

These conductor pastes were applied (printed) in a predetermined pattern to a glass substrate by general screen printing. In this screen printing, a 400 mesh screen was used. Then, the applied conductor pastes were subjected to a drying treatment at 100° C. for 15 min with a far infrared dryer, and then subjected to a firing treatment at 800° C. for one hour in an electrical furnace. Thus, a conductor pattern was formed on the substrate.

The screen printing was performed such that conductor patterns in the form of a plurality of parallel lines (linear conductor films) having a length of about 15 to 20 mm (desired value) were formed after firing, the desired values of the line width/line gap (L/S) of these linear conductor films was 30 μm /30 μm, and the desired thickness was about 20 μm. Each conductor paste was printed continuously (repeatedly) with respect to five substrates, and the conductor paste printed on the fifth substrate was dried and fired so that a conductor pattern was produced.

A conductor pattern whose desired value of L/S was 40 μm/40 μm and a conductor pattern whose desired value of L/S was 50 μm /50 μm were produced on the substrates in the same manner as above except that the desired value of the line width/line gap (L/S) was changed.

Figure 2:
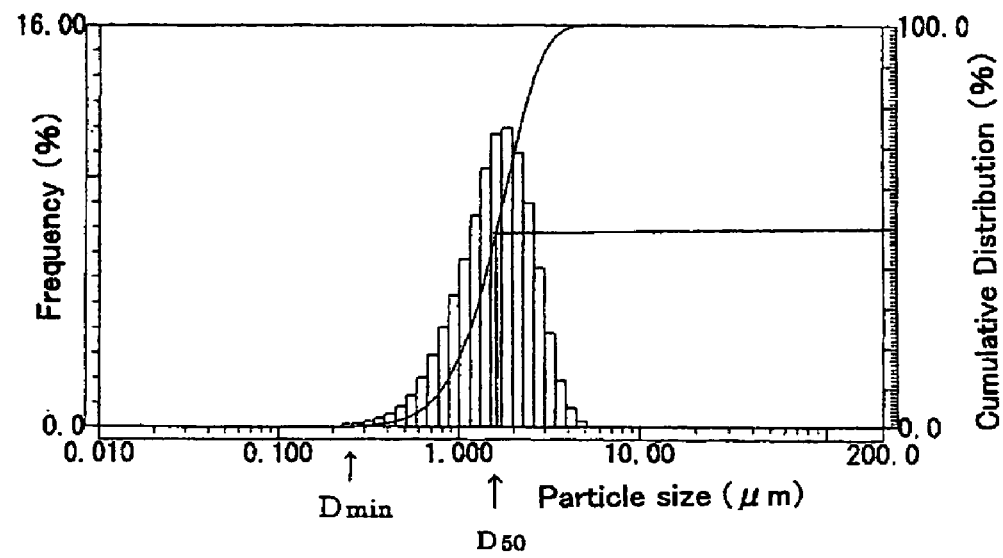
FIG. 2 is a graph showing the results of particle size distribution measurement of an Ag powder contained in a commercially available conductor paste 1.

Using a commercially available conductor paste, the above-described three types of conductor patterns were produced on the substrates by performing screen printing and firing in the same manner as above. This conductor paste (hereinafter, referred to as "commercial product 1") contained an Ag powder in a ratio of about 85 mass %. The average particle size of the Ag powder was about 1.6 μm, and the particle size ratio $D_{50}/D_{min}$ was about 6.3 ($D_{50}$=about 1.6 μm, $D_{min}$=about 0.26 μm). FIG. 2 shows the results of the particle size distribution measurement (based on the volume) of the Ag powder contained in the commercial product 1.

The viscosity of the conductor paste of the commercial product 1 was measured in the same manner as above and the viscosity at 10 rpm was about 200 Pa.s. The viscosity ratio ($V_{1rpm}/V_{10rpm}$) was about 2. The organic solvent contained in the conductor paste of the commercial product 1 was terpineol (boiling point: about 225° C.).

Each linear conductor film of the obtained conductor patterns was examined regarding whether or not there was a disconnection, using a tester. Thus, the disconnection ratios (%) of the conductor patterns formed of the conductor paste of the samples 1 to 4 and the commercial product 1 were obtained. The fine line formation suitability of each conductor paste was evaluated with these disconnection ratios as the indicator. That is to say, the lower the disconnection ratio was, the better the fine line formation suitability was. Table 1 shows the evaluation results of the disconnection ratio together with the characteristics of the Ag particles constituting each conductor paste (sample).

TABLE 1

| conductor paste | sample 1 | sample 2 | sample 3 | sample 4 | commercial product 1 |
|---|---|---|---|---|---|
| Ag powder | | | | | |
| type | Ag powder 1 | Ag powder 2 | Ag powder 3 | Ag powder 4 | — |
| average particle size (μm) | 0.3 | 0.7 | 1.0 | 1.2 | 1.6 |
| D50/Dmin | 3 | 3.5 | 4.5 | 5.5 | 6.3 |
| disconnection ratio (%) | | | | | |
| L/S = 30/30 μm | 15 | 30 | 75 | 100 | 100 |
| L/S = 40/40 μm | 0 | 0 | 44 | 75 | 100 |
| L/S = 50/50 μm | 0 | 0 | 28 | 63 | 100 |

As seen from Table 1, in the conductor patterns formed by the conductor pastes of the samples 1 and 2, the disconnection ratios ware evidently lower than that of the conductor patterns formed by the conductor pastes of the commercial product 1, the samples 3 and 4. In other words, the fine line formation suitability of the conductor pastes of the sample 1 and 2 was better.

Thus, according to the conductor paste of an embodiment of the present invention, regarding the conductor pattern formed by firing the conductor paste printed on the fifth substrate by screen printing, it was possible to realize a disconnection ratio of 5% or less (more preferably 1% or less) when the L/S (desired value) of that conductor pattern was 40 μm /40 μm. It was possible to realize a disconnection ratio of 50% or less (more preferably 25% or less) when the L/S (desired value) was 30 μm /30 μm.

Experiment Example 2

In this experiment example, the effect of the radio (metal content) of the Ag powder contained in the conductor paste on the fine line formation suitability was examined.

Conductor pastes of samples 5 to 7 were prepared by kneading the Ag powder 1 and an organic vehicle such that the content ratio (metal content) of the Ag powder became about 80 mass % (sample 5), about 85 mass % (sample 6), about 90 mass % (sample 7). As the organic vehicle, a vehicle in which ethyl cellulose as an organic binder was dissolved in butyl carbitol, 2,2,4-trimethyl-1,3-pentanediol monoisobutyrate (boiling point: about 248° C.) or a mixed solvent of these solvents was used. These conductor pastes contained ethyl cellulose in a ratio of about 2 parts by mass with respect to 100 parts by mass of the Ag powder. The viscosities of the obtained conductor pastes were adjusted so as to be substantially the same (about 250 Pa.s under the measurement conditions at 10 rpm in this example) by the composition of the solvent constituting the organic vehicle.

Using the conductor pastes of the samples 5 to 7, conductor patterns whose desired value of L/S was 30 μm/30 μm were produced on substrates in the same manner as in Experiment Example 1. The shape precision of the conduct of patterns was evaluated by observing the conductor pattern with an optical microscope. This evaluation was performed with respect to the conductor pattern obtained by firing the conductor paste printed on the fifth substrate in the same manner as in Experiment Example 1. The conductor pattern was observed primarily from the following points: (1) whether or not there was roughness (swell) that is not intended on the surface and/or the edge of the lines and its extent; (2) whether or not there was a protrusion on the lines and its extent; (3) whether or not there was blur of the lines (shape change of the line) and its extent; and (4) whether or not there was a disconnection and its extent. The degree of the shape precision (fine line formation suitability) of the conductor pattern was determined comprehensively from these observation results. Table 2 shows the results. In Table 2, "VG" indicates that the shape precision was very good. "G" indicates that the shape precision was good, and "NG" indicates that the shape precision was not bad.

TABLE 2

| conductor paste | sample 5 | sample 6 | sample 7 |
|---|---|---|---|
| Ag powder content ratio (mass %) | 80 | 85 | 90 |
| line quality (L/S = 30/30 μm) | NG | G | VG |

As seen from Table 2, good results were obtained when the content ratio of the Ag powder was 85 mass % or more (85 to 90 mass %), and particularly good results were obtained when the content ratio of the Ag powder was 90 mass %.

When a conductor pattern whose desired value of L/S was 40 μm/40 μm was formed with the conductor paste of the sample 5 and the shape precision thereof was evaluated, then good evaluation results ("G") were obtained.

Experiment Example 3

In this experiment example, conductor pastes were printed repeatedly by screen printing, and the change of the shape precision of the conductor pattern formed at that time was examined.

A conductor paste of a sample 8 was prepared by kneading the Ag powder 1 and an organic vehicle such that the content ratio (metal content) of the Ag powder became about 85 mass %. As the organic vehicle, a vehicle in which ethyl cellulose was dissolved in butyl carbitol was used. This conductor paste contained ethyl cellulose in a ratio of about 2 parts by mass with respect to 100 parts by mass of the Ag powder.

Using the conductor paste of the sample 8 and the conductor paste of the commercial product 1 (the main component of the organic solvent: butyl carbitol), a conductor pattern whose desired value of L/S was 30 μm/30 μm was printed on a glass substrate repeatedly in the same manner as in Experiment Example 1. The conductor patterns were produced by firing the conductor pastes corresponding to the $10^{th}$ printing on a substrate (that is, a $10^{th}$ printed substrate), the $25^{th}$, $50^{th}$, $75^{th}$, and $100^{th}$ printing. The shape precision of the obtained conductor patterns was evaluated in the same manner as in Experiment Example 2. Table 3 shows the results. In Table 3, "VG" indicates that the shape precision was very good. "G" indicates that the shape precision was good, and "P" indicates that the shape precision was poor.

TABLE 3

|  | number of printing (times) | | | | |
| --- | --- | --- | --- | --- | --- |
|  | 10 | 25 | 50 | 75 | 100 |
| sample 8 | | | | | |
| L/S = 30/30 μm | VG | VG | VG | G | G |
| L/S = 40/40 μm | VG | VG | VG | VG | G |
| L/S = 50/50 μm | VG | VG | VG | VG | VG |
| commercial product 1 | | | | | |
| L/S = 30/30 μm | P | P | P | P | P |
| L/S = 40/40 μm | P | P | P | P | P |
| L/S = 50/50 μm | VG | P | P | P | P |

As seen from Table 3, with the conductor paste of the sample 8, a conductor pattern having a good shape precision could be formed, even if printing was performed continuously and repeatedly by screen printing. This was relevant to the fact that the conductor paste of the sample 8 was hardly clogged in the screen.

Experiment Example 4

In this experiment example, the effect of the amount of the organic binder used on the fine line formation suitability was examined.

Conductor pastes of samples 9 and 10 were prepared using the Ag powder 1 in the same manner as in Experiment Example 3, except that the content ratio of ethyl cellulose was about 1.5 parts by mass (sample 9) and about 3 parts by mass (sample 10) with respect to 100 parts by mass of the Ag powder.

Regarding these conductor pastes and the conductor paste of the sample 8, the shape precision of the conductor patterns (desired L/S=30 μm/30 μm) formed by firing the conductor pastes printed on the fifth substrate was evaluated in the same manner as in Experiment Example 2. Table 4 shows the results. In Table 4, "VG" indicates that the shape precision was very good, and "G" indicates that the shape precision was good.

TABLE 4

|  | sample 9 | sample 8 | sample 10 |
| --- | --- | --- | --- |
| resin amount (with respect to 100 parts by mass of Ag powder) | 1.5 parts by mass | 2 parts by mass | 3 parts by mass |
| line quality (L/S = 30/30 μm) | VG | VG | G |

As seen from Table 4, all the conductor pastes in which the content ratio of the organic binder (ethyl cellulose in this example) was 3 parts by mass or less (1.5 to 3 parts by mass) with respect to the Ag powder could form a conductor pattern having a good shape precision. The samples 8 and 9 in which the content ratio of the organic binder was 2 mass % or less (1.5 to 2 parts by mass) provided particularly good results.

Experiment Example 5

In this experiment example, the effect of the amount of the plasticizer used on the fine line formation suitability was examined.

Conductor pastes of samples 11 to 13 were prepared, using the Ag powder 1, in the same manner as in Experiment Example 3 except that dioctylphthalate (DOP) as a plasticizer was mixed in a ratio of about 0.5 parts by mass (sample 11), about 1 part by mass (sample 12) and about 2 parts by mass (sample 13).

Regarding these conductor pastes, the shape precision of the conductor patterns (desired L/S=30 μm/30 μm) formed by firing the conductor pastes printed on the fifth substrate was evaluated in the same manner as in Experiment Example 2. Table 5 shows the results. In Table 5, "VG" indicates that the shape precision was very good, and "G" indicates that the shape precision was good.

TABLE 5

| conductor paste | sample 11 | sample 12 | sample 13 |
| --- | --- | --- | --- |
| plasticizer amount (with respect to 100 parts by mass of Ag powder) | 0.5 parts by mass | 1 part by mass | 2 parts by mass |
| line quality (L/S = 30/30 μm) | VG | VG | G |

As seen from Table 5, all the conductor pastes in which the content ratio of the plasticizer (DOP in this example) was 2 parts by mass or less (0.5 to 2 parts by mass) with respect to the Ag powder could form a conductor pattern having a good shape precision. The samples 11 and 12 in which the content ratio of the plasticizer was 1 mass % or less (0.5 to 1 parts by mass) provided particularly good results.

Experiment Example 6

In this experiment example, the effect of the type of the solvent constituting the organic vehicle on the fine line formation suitability was examined.

Conductor pastes were prepared by kneading the Ag powder 1 and organic vehicles in which ethyl cellulose was dissolved in various solvents such that the content ratio (metal content) of the Ag powder was about 85 mass %. These conductor pastes contained ethyl cellulose in a ratio of about 2 parts by mass with respect to 100 parts by mass of the Ag powder. In this example, as the organic solvents, butyl carbitol (boiling point: about 230° C., corresponding to the composition of the sample 8), 2,2,4-trimethyl-1,3-pentanediol monoisobutyrate (boiling point: about 248° C., sample 14), butyl carbitol acetate (boiling point: about 245° C., sample 15), terpineol (boiling point: about 225° C., sample 16), and menthanol (boiling point: about 216° C., sample 16) were used. Conductor pastes of samples 18 to 22 were prepared in the same manner as above except that the Ag powder 1 was replaced by the Ag powder 2.

Using these conductor pastes, conductor patterns whose desired value of L/S was 50 μm/50 μm to 70 μm/70 μm were produced in the same manner as in Experiment Example 1. Then, the shape precision of the conductor patterns formed by firing the conductor pastes printed on the fifth substrate was evaluated in the same manner as in Experiment Example 2. Tables 6 and 7 show the results. In Tables 6 and 7, "VG" indicates that the shape precision was very good. "VG-G" indicates that the shape precision was fairly good. "G" indicates that the shape precision was good, and "NG" indicates that the shape precision was not bad. In Tables 6 and 7, "BC" as a type of solvent indicates butyl carbitol, "TPI" indicates 2,2,4-trimethyl-1,3-pentanediol monoisobutyrate, and "BCA" indicates butyl carbitol acetate.

TABLE 6

| conductor paste | sample 8 | sample 14 | sample 15 | sample 16 | sample 17 |
|---|---|---|---|---|---|
| type of Ag powder | Ag powder 1 | Ag powder 1 | Ag powder 1 | Ag powder 1 | Ag powder 1 |
| type of solvent | BC | TPI | BCA | terpineol | menthanol |
| line quality (L/S = 50/50~70/70 μm) | VG | VG | VG | NG | NG |

TABLE 7

| conductor paste | sample 18 | sample 19 | sample 20 | sample 21 | sample 22 |
|---|---|---|---|---|---|
| type of Ag powder | Ag powder 2 | Ag powder 2 | Ag powder 2 | Ag powder 2 | Ag powder 2 |
| type of solvent | BC | TPI | BCA | terpineol | menthanol |
| line quality (L/S = 50/50~70/70 μm) | G–VG | G | G–VG | NG | NG |

As shown in Tables 6 and 7, the conductor pastes (samples 8, 14, 15 and samples 18 to 20) using the organic solvents having a boiling point of 230° C. or more could provide a conductor pattern having an even better shape precision than the conductor pastes (samples 16, 17, 21 and 22) using the organic solvents having a lower boiling point.

Experiment Example 7

This example shows that the shape precision depends on the type of conductor paste.

Figure 3:
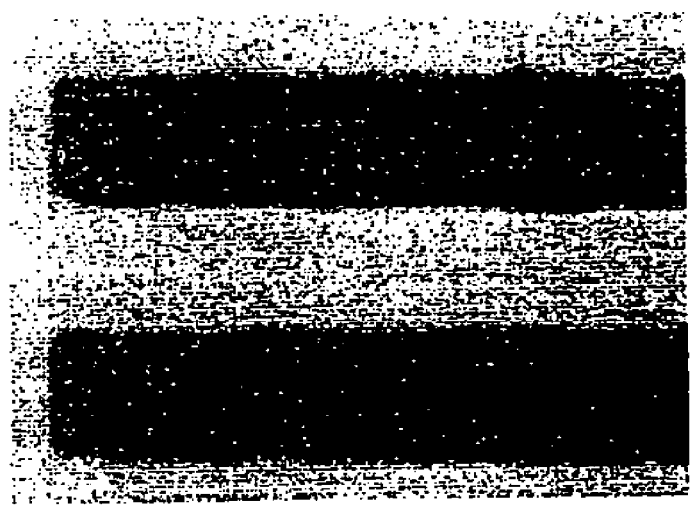
FIG. 3 is an optical microphotograph of a dry film formed with a conductor paste of a sample 8.

Using the conductor paste of the sample 8, a conductor pattern whose desired value of L/S was 100 μm/100 μm was printed on a glass substrate by screen printing. Then, the printed conductor paste was dried in the same manner as in Experiment Example 1. FIG. 3 shows an optical microphotograph of the dried film FIG. 4 shows an optical microphotograph of the dried film obtained by printing and drying the conductor paste of the commercial product 1 in the same manner.

Figure 4:
FIG. 4 is an optical microphotograph of a dry film formed with a conductor paste of a commercially available product 1.

As seen from the comparison of FIGS. 3 and 4, the dried film formed of the conductor paste of the sample 8 had a better shape precision than the dried film formed by the conductor paste of the commercial product 1. More specifically, this can be understood by the fact that in the dried film formed by the conductor paste of the sample 8, there was little roughness (swell) in the line edges, or the like.

Figure 5:
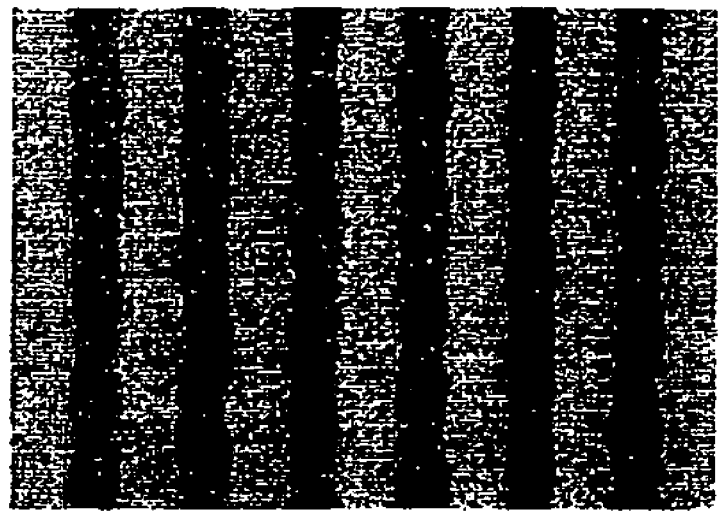
FIG. 5 is an optical microphotograph of a conductor pattern formed with the conductor paste of the sample 8.
Figure 6:
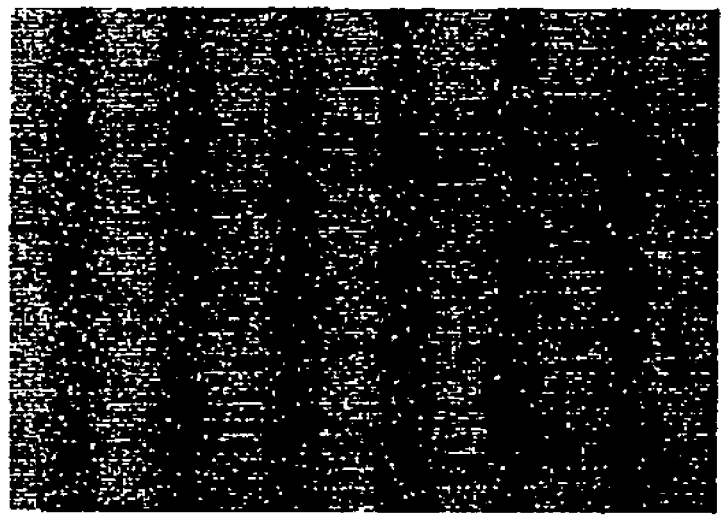
FIG. 6 is an optical microphotograph of a conductor pattern formed with the commercially available conductor paste.

Using the conductor paste of the sample 8, a conductor pattern whose desired value of L/S was 50 μm/50 μm was printed on a glass substrate by screen printing. The printed conductor paste was dried and fired in the same manner as in Experiment Example 1. FIG. 5 shows an optical microphotograph of the obtained conductor pattern (fired film). FIG. 6 shows an optical microphotograph of the conductor pattern obtained by printing, drying and firing the conductor paste of the commercial product 1 in the same manner.

As seen from the comparison of FIGS. 5 and 6, the conductor pattern formed of the conductor paste of the sample 8 had a better shape precision than the conductor pattern formed of the conductor paste of the commercial product 1. More specifically, this can be understood by the fact that in the conductor pattern formed by the conductor paste of the sample 8, there was little roughness (swell) in the line edges, or the like. Furthermore, it was found that the conductor paste of the sample 8 provided a more dense fired film than the commercial product 1.

Specific examples of the present invention have been described above, but they are only illustrative and not limiting the scope of the claims. All changes and modifications from the specific examples illustrated above are intended to be embraced in the techniques disclosed in the appended claims.

The technical elements described in the specification or the drawings can exhibit technical usefulness, either alone or in combination, and combinations are not limited to those described in the claims as filed. The techniques illustrated in the specification or the drawings can achieve a plurality of purposes at the same time, and achieving only one of them has technical usefulness.

What is claimed is:

1. A method for producing a conductor paste comprising:
   preparing a conductive metal powder made of a noble metal or an alloy based on a noble metal;
   classifying said powder with a centrifugal separator such that the classified powder having an average particle size of 0.8 μm or less, and a ratio ($D_{50}/D_{min}$) of a medium value $D_{50}$ of the particle size to a minimum value $D_{min}$ of detectable particle sizes of 1 to 5 can be obtained; and
   mixing said powder and an organic vehicle such that a conductor paste having a ration ($V_{1rpm}/V_{10rpm}$) of a viscosity $V_{1rpm}$ measured under conditions at 1 rpm with a spindle No. 4 with a Brookfield rotational viscometer and a viscosity $V_{1rpm}$ measured under conditions at 10 rpm with a spindle No. 4 from 2 to 5, and containing the powder in a mass ratio of 80 mass % or more can be obtained.

2. The method according to claim 1, wherein the viscosity ratio is adjusted by mixing a viscosity modifier.

3. The method according to claim 2, wherein the viscosity modifier is mixed in a ratio of 0.05 to 3 parts by mass with respect to 100 parts by mass of the conductive powder.

4. The method according to claim 3, wherein the viscosity modifier is one or at least two plasticizer selected from the group consisting of dioctylphthalate, dioctyladipate, and dibutylphthalate.

5. The method according to claim 1, wherein the powder and the organic vehicle is mixed such that the conductor paste having the viscosity $V_{1rpm}$ of 200 to 700 Pa.s, and the viscosity $V_{1rpm}$ of 100 to 300 Pws can be obtained.

6. The method according to claim 1, wherein a solvent constituting the organic vehicle has a boiling point of 230 to 260° C.

7. The method according to claim 6, wherein the solvent comprises one or at least two selected from the group consisting of butyl carbitol, butyl carbitol acetate, and 2,2,4-trimethyl-1,3-pentanediol monoisobutyrate.

8. The method according to claim 1, wherein the conductive powder is made of silver or an alloy based on silver.

9. The method according to claim 1, wherein the classification is performed such that the classified powder having $D_{50}$ of about 0.3 μm and $D_{min}$ of about 0.06 to 0.25 μm can be obtained.

10. The method according to claim 1, wherein the classification is performed such that the classified powder having D50 of about 0.7μm and $D_{min}$ of about 0.14 to 0.6 μm can be obtained.

11. The method according to claim 1, wherein:
the conductive powder is made of silver or an alloy based on silver;
the classification is performed such that the classified powder having D50 of about 0.3 μm and $D_{min}$ of about 0.06 to 0.25 μm can be obtained;
the powder and the organic vehicle is mixed such that the conductor paste having the viscosity $V_{10rpm}$ of 100 to 300 Pa.s and the viscosity ratio of 3 to 4 can be obtained;
the viscosity ratio of the paste is adjusted by mixing a viscosity modifier;
the viscosity modifier is mixed in a ratio of 1.5 to 3 parts by mass with respect to 100 parts by mass of the conductive powder;
the paste comprising 1.5 to 2 parts by mass of ethyl cellulose as a viscosity modifier with respect to 100 parts by mass of the conductive powder; and
a solvent constituting the organic vehicle is one or at least two selected from the group consisting of butyl carbitol, butyl carbitol acetate, and 2,2,4-trimethyl-1,3-pentanediol monoisobutyrate.

12. The method according to claim 1, wherein the paste further comprises 0.5 to 1 parts by mass of dioctylphthalate as a viscosity modifier with respect to 100 parts by mass of the conductive powder.

13. A method for producing an electronic component comprising a base material on which a film conductor is formed, comprising the steps of:

preparing a conductive metal powder made of a noble metal or an alloy based on a noble metal;
classifying said powder with a centrifugal separator such that the classified powder having an average particle size of 0.8 μm or less, and a ratio ($D_{50}/D_{min}$) of a medium value $D_{50}$ of the particle size to a minimum value $D_{min}$ of detectable particle sizes of 1 to 5 can be obtained;
mixing said powder and an organic vehicle such that a conductor paste having a ration ($V_{1rpm}/V_{10rpm}$) of a viscosity $V_{1rpm}$ measured under conditions at 1 rpm with a spindle No. 4 with a Brookfield rotational viscometer and a viscosity $V_{10rpm}$ measured under conditions at 10 rpm with a spindle No. 4 from 2 to 5, and containing the powder in a mass ratio of 80 mass % or more can be obtained;
attaching the conductor paste onto the base material; and
firing the attached conductor paste.

14. The method according to claim 13, wherein in the attaching step, the conductor paste is attached to the base material by screen printing.

15. The method according to claim 13, wherein the base material is a glass substrate.

16. The method according to claim 13, wherein the firing step is performed at a maximum firing temperature of 600 to 900° C.

* * * * *